(12) United States Patent
Matsumoto

(10) Patent No.: US 6,376,362 B1
(45) Date of Patent: Apr. 23, 2002

(54) PRODUCTION OF SEMICONDUCTOR DEVICE

(75) Inventor: Muneyuki Matsumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/546,172

(22) Filed: Apr. 11, 2000

(30) Foreign Application Priority Data

Apr. 12, 1999 (JP) .............................. 11-104314

(51) Int. Cl.⁷ ....................... H01L 21/44; H01L 21/4763
(52) U.S. Cl. ..................... 438/633; 438/612; 438/642
(58) Field of Search ........................... 438/633, 642, 438/612, 617

(56) References Cited

U.S. PATENT DOCUMENTS 5,627,345 A * 5/1997 Yamamoto et al. ......... 174/265

FOREIGN PATENT DOCUMENTS

| JP | 7-263589 | 10/1995 |
|----|----------|---------|
| JP | 9-213699 | 8/1997  |

* cited by examiner

Primary Examiner—Alexander G. Ghyka
(74) Attorney, Agent, or Firm—Arent Fox Kintner Plotkin & Kahn, PLLC

(57) ABSTRACT

A method of producing a semiconductor device having a connecting thin film for connection to a bonding wire on a bonding pad formed on a surface of a surface protective film. A recess is formed in the surface of the surface protective film. Thereafter, a metal deposited layer composed of a material for the bonding pad is formed, and a metal thin film composed of a material for the connecting thin film is further formed thereon. After the metal thin film is formed, unnecessary parts of the metal deposited layer and the metal thin film are removed by chemical mechanical polishing, for example.

9 Claims, 2 Drawing Sheets

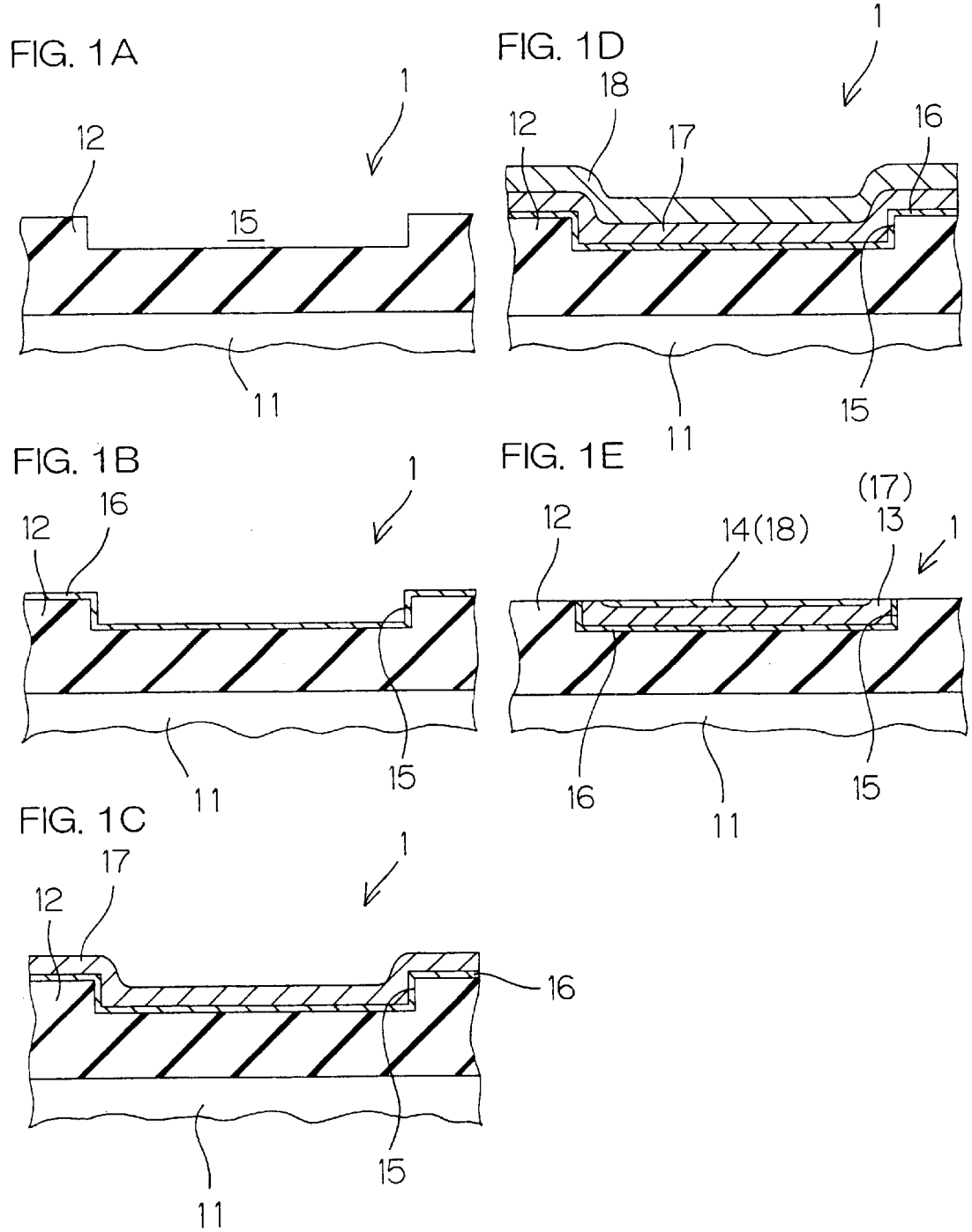

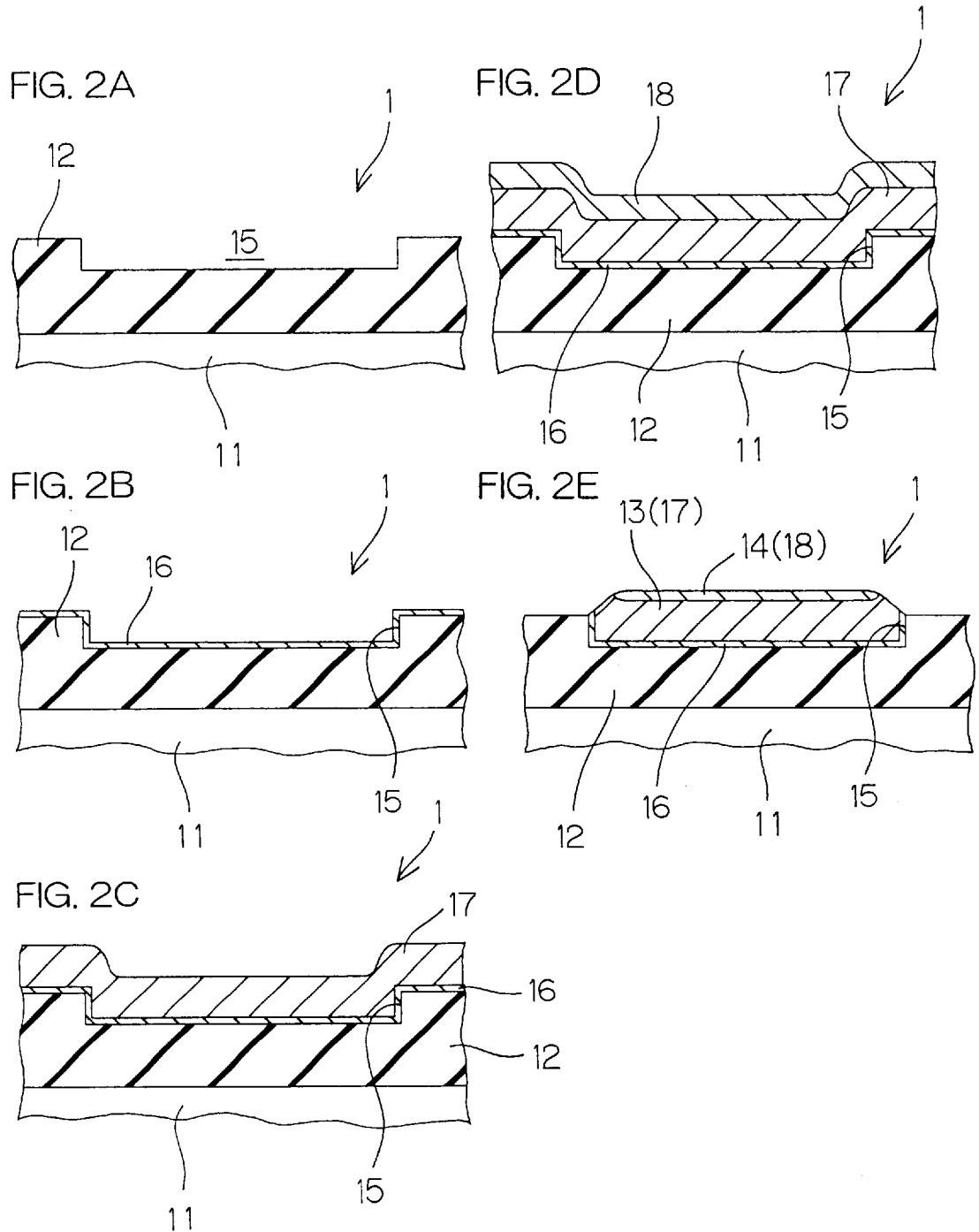

PRODUCTION OF SEMICONDUCTOR DEVICE

BACKGROUND OF THE INVENTION

1. Field of the Invention

The present invention relates to a method of producing a semiconductor device having a connecting thin film for connection to a bonding wire on a bonding pad.

2. Description of Related Art

Electrical connection between a semiconductor chip and a lead frame is generally achieved by connecting a bonding pad formed on a surface of the semiconductor chip and a lead electrode provided on the lead frame by a gold thin line, for example.

When copper is used as a wiring material, a metal material such as copper can be used as a material for the bonding pad. Copper is low in electrical resistance. When copper is used as the material for the bonding pad, therefore, power consumption in the semiconductor chip can be reduced, and the processing speed of the semiconductor chip can be also increased. Further, the bonding pad is prevented from generating much heat to adversely affect a functional element or the like from being adversely affected, when a large current is supplied to the semiconductor chip.

When copper is used as the material for the bonding pad, however, the bonding pad and the gold thin line may be insufficiently connected to each other due to bad adhesion between the bonding pad and the gold thin line. When copper is used as the material for the bonding pad, therefore, a connecting thin film composed of an aluminum series alloy is provided on the bonding pad, and the gold thin line is bonded to the connecting thin film. Consequently, it is possible to prevent the bonding pad composed of copper and the gold thin line from being insufficiently connected to each other.

When the connecting thin film composed of an aluminum series alloy is formed on the bonding pad, a patterning film having an opening opposite to the bonding pad is stacked on a surface protective film having the bonding pad formed therein, for example. An aluminum series alloy is deposited on the bonding pad exposed through the opening of the patterning film, thereby making it possible to form the connecting thin film. If the connecting thin film is formed in this method, however, the number of steps of producing the semiconductor chip is increased. As a result, the number of steps of producing a semiconductor device using the semiconductor chip is increased.

SUMMARY OF THE INVENTION

An object of the present invention is to provide a method of producing a semiconductor device, in which a connecting thin film can be formed in a small number of steps.

The present invention relates to a method of producing a semiconductor device having a connecting thin film for connection to a bonding wire on a bonding pad formed on a surface of a surface protective film. The method according to the present invention comprises the steps of forming a recess on the surface of the surface protective film; forming a metal deposited layer composed of a material for the bonding pad on the surface of the surface protective film having the recess formed therein; forming a metal thin film composed of a material for the connecting thin film on a surface of the formed metal deposited layer; and removing unnecessary parts of the metal deposited layer and the metal thin film after forming the metal thin film. The unnecessary parts of the metal deposited layer and the metal thin film can be removed by polishing processing, for example.

It is preferable to use a material having good adhesion to both the bonding pad and the bonding wire as the material for the connecting thin film. For example, when the bonding pad is composed of copper, and the bonding wire is a gold thin line composed of gold, it is preferable that a metal containing aluminum, for example, aluminum, an aluminum-silicon alloy, an aluminum-copper alloy, or an aluminum-silicon-copper alloy, is used as the material for the connecting thin film.

The unnecessary part of the metal deposited layer and the metal thin film are portions which should be removed in order to isolate the bonding pad from the other bonding pad. Respective examples are parts, outside the recess, of the metal deposited layer and the metal thin film, as viewed from the top.

According to this method, the recess is formed on the surface of the surface protective film, and the metal deposited layer composed of the material for the bonding pad is then stacked on the surface protective film having the recess formed therein. Further, the metal thin film composed of the material for the connecting thin film is stacked on the surface of the metal deposited layer, and the unnecessary parts of the metal deposited layer and the metal thin film are then removed, thereby forming the bonding pad and the connecting thin film. Accordingly, the connecting thin film can be formed in a smaller number of steps, as compared with that in a method of forming the connecting thin film by a photolithographic technique, for example.

The metal deposited layer may be formed to such a thickness that the height of a surface of its portion within the recess is smaller than the height of the surface, outside the recess, of the surface protective film. In this case, it is preferable that the metal thin film is formed to such a thickness that the height of a surface of its portion opposite to the recess is not less than the height of the surface, outside the recess, of the surface protective film.

In this case, the step of removing the unnecessary parts of the metal deposited layer and the metal thin film may be the step of polishing the metal deposited layer and the metal thin film by chemical mechanical polishing, for example. It is preferable that the polishing step is performed until the surfaces of the metal deposited layer and the metal thin film are almost flush with the surface, outside the recess, of the surface protective film. Consequently, at the time point where the surface, outside the recess, of the surface protective film is exposed, it is possible to obtain the bonding pad and the connecting thin film which are embedded in the recess.

Furthermore, the metal deposited layer may be formed to such a thickness that the height of the surface of its portion opposite to the recess is not less than the height of the surface, outside the recess, of the surface protective film.

In this case, the step of removing the unnecessary parts of the metal deposited layer the metal thin film may be the step of polishing the metal deposited layer and the metal thin film by chemical mechanical polishing, for example. If the polishing rate of the metal deposited layer is set to one higher than the polishing rate of the metal thin film, the metal thin film can be left in the portion opposite to the recess of the metal thin film even if the metal deposited layer and the metal thin film are polished until the surface, outside the recess, of the surface protective film is exposed. In this case, it is possible to obtain the bonding pad and the connecting thin film which are raised from the recess.

It is preferable that the metal thin film is formed to such a thickness that its part remaining when the polishing step is terminated can cover at least a part of the surface, inside the recess, of the metal deposited layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A to 1E are cross-sectional views showing the steps of producing a semiconductor device according to an embodiment of the present invention; and FIGS. 2A to 2E are cross-sectional views showing the steps of producing a semiconductor device according to another embodiment of the present invention.

DESCRIPTION OF THE PREFERRED EMBODIMENTS

FIGS. 1A to 1E are cross-sectional views showing the steps of a method of producing a semiconductor device according to an embodiment of the present invention. The producing method shown in FIGS. 1A to 1E is a method of forming a bonding pad 13 composed of copper, for example, on a surface of a surface protective film 12 on a semiconductor substrate 11 constituting a base body of a semiconductor chip 1, and forming a connecting thin film 14 on the bonding pad 13.

As shown in FIG. 1A, a recess 15 for embedding a bonding pad is first formed by a photolithographic technique, for example, in a portion, corresponding to an area where the bonding pad 13 is to be formed, on the surface of the surface protective film 12 formed on the semiconductor substrate 11. The recess 15 is an approximate square whose side has a length of approximately 70 to 100 $\mu$m, as viewed from the top, for example, and is formed such that the depth thereof from the surface of the surface protective film 12 is approximately 0.5 to 2 $\mu$m.

As shown in FIG. 1B, a barrier metal film 16 is then formed by sputtering, for example, on the surface of the surface protective film 12 having the recess 15 formed therein. The barrier metal film 16 is for preventing a metal composing the bonding pad 13 from being diffused into the surface protective film 12. When the bonding pad 13 is composed of copper, for example, the barrier metal film 16 can be composed of titanium nitride, tantalum nitride, or tungsten nitride.

As shown in FIG. 1C, copper which is the material for the bonding pad 13 is then deposited on the surface of the barrier metal film 16, to form a metal deposited layer 17. The metal deposited layer 17 is formed to such a thickness that a surface of its portion within the recess 15 is lower than the surface, outside the recess 15, of the surface protective film 12. When the depth of the recess 15 is approximately 1 $\mu$m, for example, the thickness of the metal deposited layer 17 may be less than approximately 1 $\mu$m and more preferably, approximately 0.6 to 0.7 $\mu$m.

Examples of a specific method of forming the metal deposited layer 17 include plating, sputtering, and CVD (Chemical Vapor Deposition).

As shown in FIG. 1D, a material for the connecting thin film 14 is deposited by sputtering, for example, on the surface of the metal deposited layer 17, to form a metal thin film 18. The metal thin film 18 is formed to such a thickness that the height of a surface of its portion opposite to the recess 15 is not less than the height of the surface, outside the recess 15, of the surface protective film 12. When the depth of the recess 15 is approximately 1 $\mu$m, and the thickness of the metal deposited layer 17 is approximately 0.7 $\mu$m, for example, the thickness of the metal thin film 18 is approximately 0.8 $\mu$m.

Used as the material for the connecting thin film 14 is a material exhibiting good adhesion to both the bonding pad 13 and a bonding wire (not shown) for connecting the bonding pad 13 to a lead electrode. When the bonding wire is a gold thin line, for example, it is preferable to use a metal containing aluminum, for example, aluminum, an aluminum-silicon alloy, an aluminum-copper alloy, or an aluminum-silicon-copper alloy.

Thereafter, CMP (Chemical Mechanical Polishing) processing is performed, to remove unnecessary parts, outside the recess 15, of the metal deposited layer 17 and the metal thin film 18 while flattening the metal deposited layer 17 and the metal thin film 18. As shown in FIG. 1E, the unnecessary parts, outside the recess 15, of the metal deposited layer 17 and the metal thin film 18 are removed, and an unnecessary part, outside the recess 15, of the barrier metal film 16 is further removed. When the surface, outside the recess 15, of the surface protective film 12 is exposed, and the surface of the surface protective film 12 is almost flush with surfaces, inside the recess, of the metal deposited layer 17 and the metal thin film 18, therefore, the CMP processing is terminated. Consequently, the bonding pad 13 composed of a remaining part of the metal deposited layer 17 and the connecting thin film 14 covering the surface of the bonding pad 13 can be obtained inside the recess 15.

The connecting thin film 14 may have an area required to bond the bonding wire, and need not cover the entire area of the surface of the bonding pad 13. When the bonding pad 13 is formed into an approximate square whose side has a length of approximately 70 to 100 $\mu$m, as viewed from the top, for example, the connecting thin film 14 may be formed so as to cover an inner area spaced approximately 1 to 3 $\mu$m apart from a peripheral edge of the bonding pad 13, as shown in FIG. 1E.

As described in the foregoing, in the producing method according to the present embodiment, the recess 15 is formed on the surface of the surface protective film 12, the metal deposited layer 17 composed of the material for the bonding pad 13 is then stacked on the surface protective film 12 having the recess 15 formed therein, the metal thin film 18 composed of the material for the connecting thin film 14 is further stacked on the surface of the metal deposited layer 17, and the unnecessary parts of the metal deposited layer 17 and the metal thin film 18 are then removed by the CMP processing, thereby simultaneously forming the bonding pad 13 and the connecting thin film 14. Accordingly, the connecting thin film 14 can be formed in a smaller number of steps, as compared with that in a method of forming the bonding pad 13 on the surface of the surface protective film 12, and then forming the connecting thin film 14 by a photolithographic technique. Consequently, it is possible to reduce the number of steps of producing the semiconductor chip 1, and therefore to reduce the number of steps of producing the semiconductor device using the semiconductor chip 1.

In the semiconductor chip 1 produced by this method, the connecting thin film 14 composed of a metal aterial exhibiting good adhesion to both the bonding ad 13 and the bonding wire is formed on the surface of he bonding pad 13.

Consequently, the semiconductor chip 1 and a lead electrode may not be insufficiently connected to each other. Accordingly, the semiconductor device using the semiconductor chip 1 becomes one of good quality eliminating the possibility that the semiconductor chip 1 and a lead frame are insufficiently connected to each other.

FIGS. 2A to 2E are cross-sectional views showing the steps of a method of producing a semiconductor device according to another embodiment of the present invention. In FIGS. 2A to 2E, sections corresponding to the sections shown in FIGS. 1A to 1E are assigned the same reference numerals.

In the producing method shown in FIGS. 1A to 1E, the metal deposited layer 17 and the metal thin film 18 are removed while being flattened by the CMP processing, so that the bonding pad 13 and the connecting thin film 14 are formed in a state where they are embedded in the recess 15. Contrary to this, in the producing method according to the present embodiment, the polishing rates of the metal deposited layer 17 and the metal thin film 18 in the CMP processing are adjusted, so that the bonding pad 13 and the connecting thin film 14 are formed in a state where they are raised from the recess 15.

As shown in FIG. 2A, a recess 15 is first formed on a surface of a surface protective film 12 formed on a semiconductor substrate 11, as in the above-mentioned embodiment. As shown in FIG. 2B, a barrier metal film 16 is formed by sputtering, for example, on the surface of the surface protective film 12 having the recess 15 formed therein.

As shown in FIG. 2C, copper which is a material for a bonding bad 13 is then deposited on a surface of the barrier metal film 16, to form a metal deposited layer 17. The metal deposited layer 17 is formed to such a thickness that the height of a surface of its portion within the recess 15 is not less than the height of the surface, outside the recess 15, of the surface protective film 12. When the depth of the recess 15 is approximately 1 $\mu$m, for example, the thickness of the metal deposited layer 17 is not less than approximately 1 $\mu$m.

As shown in FIG. 2D, a metal thin film 18 composed of a material for a connecting thin film 14 is then formed by sputtering, for example, on the surface of the metal deposited layer 17. When the thickness of the metal deposited layer 17 is approximately 1.2 $\mu$m, for example, the thickness of the metal thin film 18 is approximately 0.3 $\mu$m.

Thereafter, the metal deposited layer 17 and the metal thin film 18 are subjected to CMP processing. In the CMP processing, a CMP chemical liquid whose ingredient is so adjusted that the polishing rate of the metal deposited layer 17 is higher than the polishing rate of the metal thin film 18 is used. After the metal thin film 18 is polished to expose a surface, outside the recess 15, of the metal deposited layer 17, therefore, a part, outside the recess 15, of the metal deposited layer 17 is polished more deeply, as compared with a part, inside the recess 15, of the metal thin film 18. As a result, at the time point where a part, outside the recess 15, of the barrier metal film 16 is removed, so that the surface, outside the recess 15, of the surface protective film 12 is exposed, as shown in FIG. 2E, the CMP processing is stopped. Consequently, it is possible to obtain the bonding pad 13 which is raised from the recess 15 and the connecting thin film 14 covering the top of the bonding pad 13.

As described in the foregoing, in the producing method according to the present embodiment, it is possible to obtain the bonding pad 13 and the connecting thin film 14 which have shapes different from those in the producing method shown in FIGS. 1A to 1E.

Although description has been made of the two embodiments, the present invention is not limited to the embodiments. Although in the above-mentioned embodiments, the bonding pad 13 is composed of copper, for example, silver (Ag) may be used in addition to copper as the material for the bonding pad 13. In this case, an aluminum series alloy, for example, can be used as the material for the connecting thin film 14.

Although the present invention has been described and illustrated in detail, it is clearly understood that the same is by way of illustration and example only and is not to be taken by way of limitation, the spirit and scope of the present invention being limited by the terms of the appended claims.

This application claims priority benefits under 35 USC § 119 of Japanese Patent Application Serial No. 11-104314 filed with the Japanese Patent Office on Apr. 12, 1999, the disclosure of which is incorporated hereinto by reference.

What is claimed is:

1. A method of producing a semiconductor device having a connecting thin film for connection to a bonding wire on a bonding pad formed on a surface of a surface protective film, comprising the steps of:

forming a recess on the surface of the surface protective film;

forming a metal deposited layer composed of a material for said bonding pad on the surface of the surface protective film having the recess formed therein;

forming a metal thin film composed of a material for said connecting thin film on a surface of the metal deposited layer thus formed; and removing unnecessary parts of said metal deposited layer and the metal thin film after forming the metal thin film.

2. The method according to claim 1, wherein the step of removing the unnecessary parts of said metal deposited layer and the metal thin film includes processing for polishing said metal deposited layer and the metal thin film.

3. The method according to claim 1, wherein the step of removing the unnecessary parts of the metal deposited layer and the metal thin film includes processing for polishing said metal deposited layer and the metal thin film by chemical mechanical polishing.

4. The method according to claim 1, wherein said metal deposited layer is formed to such a thickness that the height of a surface of its portion within said recess is smaller than the height of the surface, outside said recess, of said surface protective film.

5. The method according to claim 4, wherein said metal thin film is formed to such a thickness that the height of a surface of its portion opposite to said recess is not less than the height of the surface, outside said recess, of said surface protective film.

6. The method according to claim 4, wherein the step of removing the unnecessary parts of the metal deposited layer and the metal thin film includes the step of polishing the metal deposited layer and the metal thin film, and the polishing step is performed until the surfaces of said metal deposited layer and the metal thin film within said recess are almost flush with the surface, outside said recess, of said surface protective film.

7. The method according to claim 1, wherein said metal deposited layer is formed to such a thickness that the height of the surface of its portion opposite to said recess is not less than the height of the surface, outside said recess, of said surface protective film.

8. The method according to claim 7, wherein the step of removing the unnecessary parts of the metal deposited layer the metal thin film includes the step of polishing the metal deposited layer and the metal thin film, and the polishing rate of said metal deposited layer in said polishing step is set to one higher than the polishing rate of said metal thin film.

9. The method according to claim 8, wherein said polishing step is carried out until the surface, outside the recess, of said surface protective film is exposed, and said metal thin film is formed to such a thickness that its part remaining when the polishing step is terminated can cover at least a part, inside said recess, of the surface of the metal deposited layer.

* * * * *